US011445589B2

(12) United States Patent
Zhang et al.

(10) Patent No.: US 11,445,589 B2
(45) Date of Patent: Sep. 13, 2022

(54) METHOD AND SYSTEM FOR ASSET LOCALIZATION, PERFORMANCE ASSESSMENT, AND FAULT DETECTION

(71) Applicant: SIGNIFY HOLDING B.V., Eindhoven (NL)

(72) Inventors: Yuting Zhang, Winchester, MA (US); Dong Han, Newton, MA (US); Sirisha Rangavajhala, Wakefield, MA (US); Talmai Brandão De Oliveira, North Andover, MA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 361 days.

(21) Appl. No.: 16/624,329

(22) PCT Filed: Jun. 18, 2018

(86) PCT No.: PCT/EP2018/066097
§ 371 (c)(1),
(2) Date: Dec. 19, 2019

(87) PCT Pub. No.: WO2019/002001
PCT Pub. Date: Jan. 3, 2019

(65) Prior Publication Data
US 2020/0128649 A1  Apr. 23, 2020

Related U.S. Application Data

(60) Provisional application No. 62/525,234, filed on Jun. 27, 2017.

(30) Foreign Application Priority Data

Jul. 6, 2017 (EP) ..................... 17179933

(51) Int. Cl.
H05B 45/50 (2022.01)
G01J 1/44 (2006.01)
(Continued)

(52) U.S. Cl.
CPC ............... H05B 45/50 (2020.01); G01J 1/44 (2013.01); G06F 16/245 (2019.01); G06F 30/27 (2020.01)

(58) Field of Classification Search
None
See application file for complete search history.

(56) References Cited

U.S. PATENT DOCUMENTS

2012/0200660 A1    8/2012  Verthein et al.
2015/0181678 A1*   6/2015  Sachs ................ H05B 47/105
                                                    315/152

(Continued)

FOREIGN PATENT DOCUMENTS

CN    102291886 A    12/2011
WO    2015132717 A1   9/2015
WO    2015173681 A1  11/2015

Primary Examiner — Anh Q Tran

(57) ABSTRACT

A method (400) for analyzing output of lighting units (10) in a lighting system (100) includes the steps of: (i) simulating (430), based on data from a photometric database (310), the output of a lighting unit; (ii) receiving and storing (420), from a database (330) of historical information, historical observed data about the output of the lighting unit; (iii) receiving (450) observed data (36) about the output of the lighting unit; (iv) generating (440) a model of the lighting system based at least in part on the simulated output of the lighting unit and the historical observed data about the output of the lighting unit, wherein the model comprises localization information for the lighting unit; and (v) comparing (470) the received observed data about the output of the lighting unit to the generated model, wherein a fault is (Continued)

detected if the observed data varies from the generated model by a predetermined amount.

15 Claims, 4 Drawing Sheets

(51) Int. Cl.
*G06F 16/245* (2019.01)
*G06F 30/27* (2020.01)

(56) References Cited

U.S. PATENT DOCUMENTS

| | | |
|---|---|---|
| 2016/0258209 A1 | 9/2016 | Berman et al. |
| 2020/0084855 A1* | 3/2020 | Parker .................... H05B 47/11 |

* cited by examiner

METHOD AND SYSTEM FOR ASSET LOCALIZATION, PERFORMANCE ASSESSMENT, AND FAULT DETECTION

CROSS-REFERENCE TO PRIOR APPLICATIONS

This application is the U.S. National Phase application under 35 U.S.C. § 371 of International Application No. PCT/EP2018/066097, filed on Jun. 18, 2018, which claims the benefit of European Patent Application No. 17179933.1, filed on Jul. 6, 2017, which claims the benefit of U.S. Provisional Patent Application No. 62/525,234, filed on Jun. 27, 2017. These applications are hereby incorporated by reference herein.

FIELD OF THE INVENTION

The present disclosure is directed generally to methods and lighting systems configured to localize lighting unit assets, and to assess performance and detect faults of lighting units within the lighting system.

BACKGROUND

Street lights and other municipal lighting units are important assets that provide critical liveability functions and services, including roadway lighting, night visibility, and public safety. Historically, these lighting units have been visually observed to obtain performance assessment and detect faults. Human inspection of each lighting unit within a lighting network, or recorded data such as geo-located illuminance data or other lighting unit images, is both subjective and labor intensive.

Accordingly, dynamic measurement devices have been created to facilitate lighting data acquisition. For example, vehicle- and/or drone-mounted sensing devices can collect geolocation and illuminance measurements, which can include timestamp, illuminance and geolocation data, and the information can be reviewed to measure performance of a lighting unit or to detect a fault with the lighting unit.

These automated methods are typically inefficient and inaccurate. For example, existing lighting asset localization methods usually analyze two-dimensional data and attempt to localize the lighting units by comparing geo-located assets to local maximum illuminance values detected from observed data. This method is noisy due to the irregularity of local maxima, the asynchrony between different sensors, and the post-hoc association from the observed data to the geolocation data.

Accordingly, there is a continued need in the art for automated methods to efficiently and accurate localize lighting unit assets within a lighting system, and to evaluate the performance of these localized lighting unit assets using observed and historical data.

SUMMARY OF THE INVENTION

The present disclosure is directed to inventive methods and apparatus for a lighting network configured to localize and analyze lighting units within the network. Various embodiments and implementations herein are directed to a system configured to obtain data about a lighting system comprising multiple distributed lighting units, such as streetlights. The system utilizes a simulation platform to simulate the output of the lighting system utilizing a photometric database populated with data about the lighting units and/or the environment. The system also utilizes a database populated with prior measurements of obtained lighting unit output. The system localizes lighting unit assets by fitting prior measurements of obtained lighting unit output using a Gaussian mixture model (GMM), and building a global background model (GBM). The system then compares the global background model to observational data about the lighting unit assets, to assess performance and detect faults. For example, if the global background model and the observational data vary by a predetermined or machine-learned amount, then a fault may be identified and the system can notify the user. According to an embodiment, the simulated data may also be utilized to augment the observational data, for example if data acquisition is sparse or below a certain threshold.

Generally, in one aspect, a method for analyzing output of one or more lighting units in a lighting system is provided. The method includes the steps of: (i) simulating, based on data from a photometric database, the output of a lighting unit; (ii) receiving, from a database of historical information, historical observed data about the output of the lighting unit; (iii) receiving observed data about the output of the lighting unit; (iv) generating a model of the lighting system based at least in part on the simulated output of the lighting unit and the historical observed data about the output of the lighting unit, wherein the model comprises localization information for the lighting unit; (v) comparing the received observed data about the output of the lighting unit to the generated model, wherein a fault is detected if the received observed data varies from the generated model by a predetermined amount.

In accordance with an embodiment, the method further includes the step of notifying a user that a fault is detected.

In accordance with an embodiment, the method further includes the step of storing, only if no fault is detected, the received observed data about the output of the lighting unit in the database of historical output information.

In accordance with an embodiment, the predetermined amount is based on a lighting standard, a luminaire specification, and/or a service level agreement.

In accordance with an embodiment, the data stored in the photometric database comprises photometric information about one or more of the lighting units.

In accordance with an embodiment, the model of the lighting system comprises topographical information about the lighting environment.

In accordance with an embodiment, the model of the lighting system comprises geolocation information about one or more of the lighting units.

In accordance with an embodiment, the method further includes the step of enhancing, using the generated model, the receiving observed data.

In accordance with an embodiment, the generated model comprises a weight for each of the one or more lighting units, and wherein the received observed data comprises a weight for each of the one or more lighting units, wherein the step of comparing the received observed data to the generated model comprises comparing the model weight to the observed weight.

In one aspect a system configured to analyze the output of one or more lighting units in a lighting system is provided. The system includes: (i) a historical database comprising historical observed data about the output of the one or more lighting units; (ii) a photometric database comprising photometric information about the one or more lighting units; (iii) a simulation module configured to simulate, based on the data from the photometric database, the output of the one or more lighting units; (iv) a training module configured to generate a model of the lighting system based at least in part on the simulated output of the one or more lighting units and the historical observed data about the output of the one or more lighting units, wherein the model comprises localization information for the one or more lighting units; and (v) an assessment module configured to compare received observed data to the generated model, wherein a fault is detected if the received observed data for one or more of the lighting units varies from the generated model for that lighting unit by a predetermined amount.

In accordance with an embodiment, the system further includes a user interface configured to provide information to a user about a detected fault.

In accordance with an embodiment, the system further includes an enhancement module configured to enhance, using the generated model, the receiving observed data.

In accordance with an embodiment, the generated model comprises a weight for each of the one or more lighting units, and the observed data comprises a weight for each of the one or more lighting units, where the assessment module is configured to compare the model weight to the observed weight.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radio luminescent sources, and luminescent polymers.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources.

In various implementations, a processor or controller may be associated with one or more storage media (generically referred to herein as "memory," e.g., volatile and nonvolatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

In one network implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present disclosure, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION OF EMBODIMENTS

The present disclosure describes various embodiments of a system configured to localize lighting units within a lighting system, and to assess the performance of those lighting units. More generally, Applicant has recognized and appreciated that it would be beneficial to provide an automated lighting network monitoring system. A particular goal of utilization of certain embodiments of the present disclosure is to notify a user that a lighting unit within the lighting system is or may be experiencing a fault that should be corrected.

In view of the foregoing, various embodiments and implementations are directed to an automated method and system configured to combine simulated data, historical data, and observational data into a model that localizes lighting units and assesses the performance of those lighting units. The system analyzes lighting unit assets by building a global background model about the lighting system and comparing the model to observational data about lighting unit assets. If the global background model and the observational data vary by a predetermined amount or above a predetermined threshold, a fault is identified and a user is notified. The user can then analyze the lighting unit and repair the fault if necessary.

Figure 1:
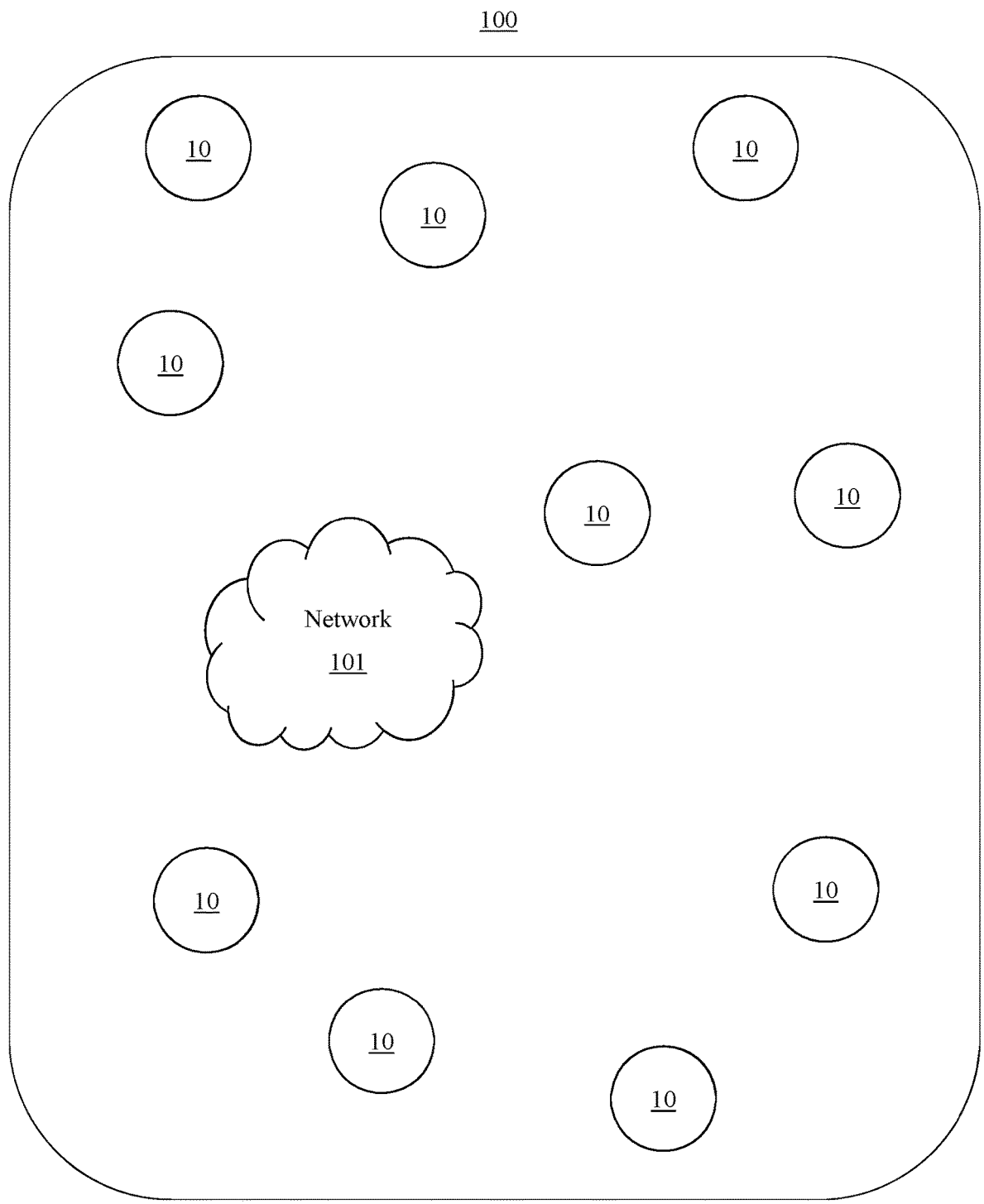
FIG. 1 is a schematic representation of a lighting system comprising a plurality of lighting units, in accordance with an embodiment.

Referring to FIG. 1, in one embodiment, is a lighting system 100 comprising a plurality of lighting units 10. The lighting system can be any lighting system or network. For example, the lighting system can be a city, town, village, or other municipality lighting system. The lighting system may be a centralized system such as a parking lot, or may be a distributed system such as a city-wide lighting system. According to another embodiment, the lighting system is an interior lighting system such as an office building, a mall, a stadium, or other structure or interior space.

According to an embodiment, the lighting units 10 within the lighting system may be networked to each other or to a remote or central server, hub, or location. The lighting units may comprise a wired and/or wireless communications module configured to communicate via a network 101 to the remote or central server, hub, or location. Wireless communication with the network can be, for example, cellular, Wi-Fi, Bluetooth, IR, radio, or near field communication, among many others.

Figure 2:
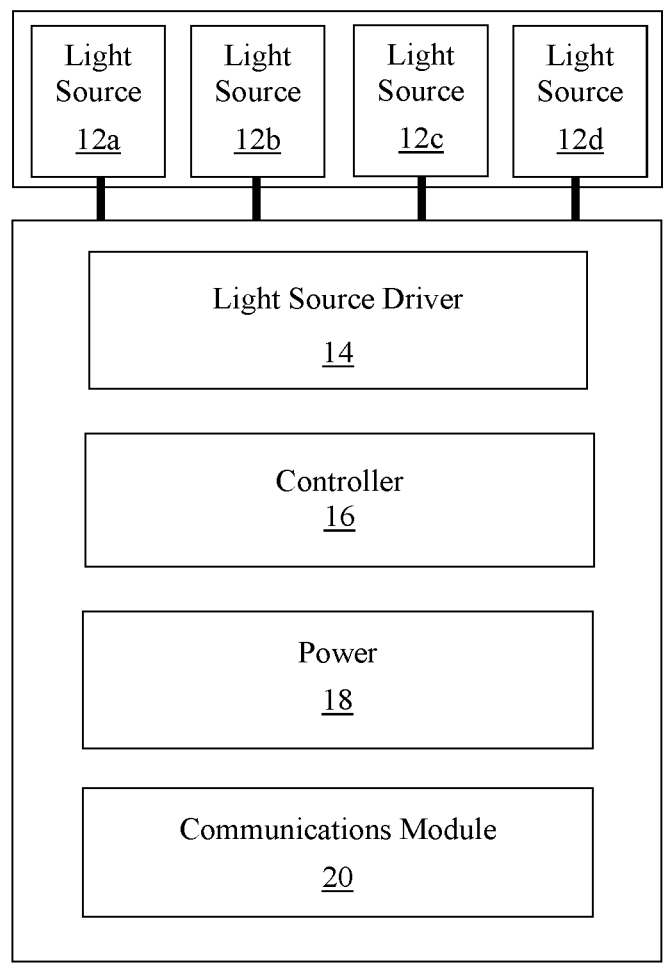
FIG. 2 is a schematic representation of a lighting unit, in accordance with an embodiment.

Referring to FIG. 2, in one embodiment, is a lighting unit 10 configured to emit light. For example, the lighting unit includes one or more light sources 12, where one or more of the light sources may be an LED-based light source. Further, the LED-based light source may have one or more LEDs. The light source can be driven to emit light of predetermined character (i.e., color intensity, color temperature) by one or more light source drivers 14. Many different numbers and various types of light sources (all LED-based light sources, LED-based and non-LED-based light sources alone or in combination, etc.) adapted to generate radiation of a variety of different colors may be employed in the lighting unit 10. According to an embodiment, lighting unit 10 can be any type of lighting fixture, including but not limited to a street light or any other interior or exterior lighting fixture. According to an embodiment, lighting unit 10 is configured to illuminate all or a portion of a target surface within a lighting environment, wherein the lighting environment can be a room, building, campus, street, city, portion of a city, or any other lighting environment. For example, according to an embodiment, the lighting environment is a city comprising a plurality of lighting units 10.

According to an embodiment, lighting unit 10 includes a controller 16 that is configured or programmed to output one or more signals to drive the one or more light sources 12a-d and generate varying intensities, directions, and/or colors of light from the light sources. Lighting unit 10 also includes a source of power 18, most typically AC power, although other power sources are possible including DC power sources, solar-based power sources, or mechanical-based power sources, among others. Lighting unit 10 can also include a communications module 20 configured for wired and/or wireless communication with other lighting units, a remote or central server or hub, or other devices.

One or more of the lighting units may be unique compared to the others within the system. According to one embodiment, each of the lighting units may be unique. The lighting units may be different sizes or shapes, may have different lighting angles, different outputs, different intensities, different colors, and/or different heights, among many other types of customizations. This complexity is often found in lighting systems within a city or municipality where the topology of the environment necessitates many lighting units each comprising a unique position within the environment.

Figure 3:
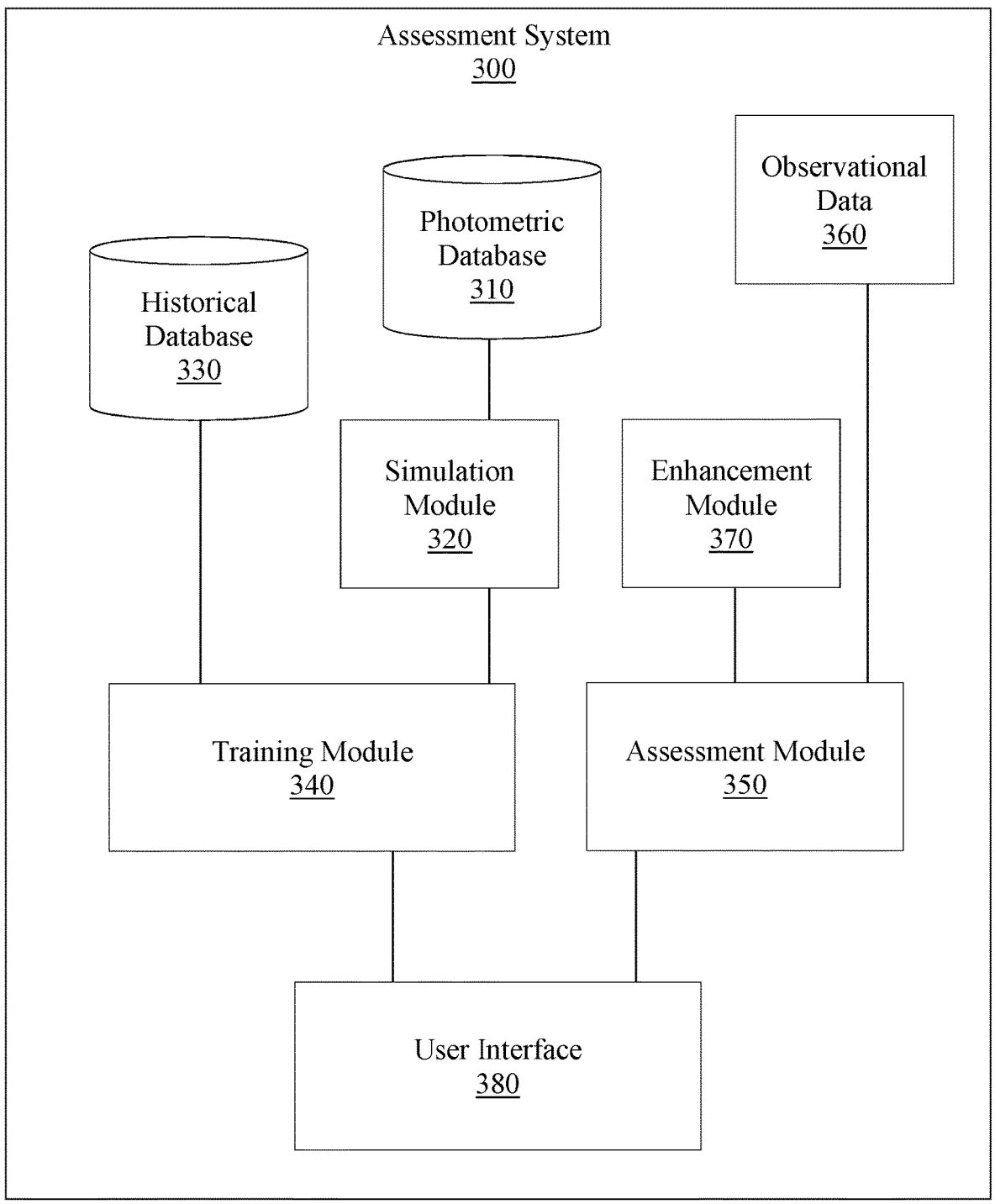
FIG. 3 is a schematic representation of an assessment system for a lighting system, in accordance with an embodiment.

Referring to FIG. 3, in one embodiment, is a schematic representation of an assessment system 300 configured to combine simulated data, historical data, and observational data into a model that localizes lighting units and assesses the performance of those lighting units. Assessment system 300, or one or more of the components of the system, may be co-localized with a lighting network 100 that it analyzes, or may be remote from the lighting network. The assessment system may service or analyze one lighting network or multiple different lighting networks.

According to an embodiment, assessment system 300 comprises a photometric database 310. Photometric database 310 comprises data about performance and other parameters of the lighting units 10 within lighting system 100. For example, the photometric database comprises information about the performance of a lighting unit in one or more situations, such as different temperatures, different weather conditions, the spatial distribution of light output from the lighting unit, and other information. Performance may include parameters about output, color, and other data about the lighting unit. The photometric data may be supplied by the manufacturer and/or supplier of the lighting unit. According to an embodiment, assessment system 300 may be configured to automatically retrieve and store photometric data within photometric database 310, such as when lighting units are purchased or commissioned within the lighting system.

A simulation module 320 of assessment system 300 accesses data within photometric database 310 to simulate a spatial lighting distribution of the lighting network within the lighting environment. For example, the simulation module may simulate the spatial lighting distribution of a plurality of streetlights located along a street, or a plurality of ceiling lights within a mall. According to an embodiment, the simulation module can consider a family of lighting simulation software and apply comprehensive simulation methodologies across all software to simulate the spatial lighting distribution. The simulation module may therefore simulate multiple lighting units, different street morphologies, mixed types of lighting units, and many other photometric characteristics.

Simulation module 320 may optionally comprise information about the lighting environment, such as the positioning of the lighting units within the environment, among many other types of information and parameters about the lighting environment. For example, the simulation module may comprise a three-dimensional map or topology information about the lighting environment and/or the lighting units within the lighting environment, localization information for the lighting units, the orientation and angling of the lighting units, timing schedules for the lighting units, ambient light, and many other types of information and parameters. For example, simulation module 320 may comprise information about which side(s) of a street comprises lighting units, the height of the lighting units on that street, the topology and shape of the street, and other factors. Using this information, simulation module 320 generates a simulated spatial lighting distribution of the lighting network within the lighting environment.

According to an embodiment, assessment system 300 comprises a historical database 330. The historical database comprises observational data collected within the lighting environment, such as illuminance data about the one or more lighting units within the lighting system. According to an embodiment, the data is geo-located, and thus the illuminance data about the one or more lighting units comprises information about the location of the lighting unit within the lighting system. The observational data may be collected by a dynamic light measurement system or device, such as an automated or manual light-detecting and/or image-capturing device that moves through the lighting system. For example, the dynamic light measurement system or device may be a sensor or sensor array mounted on a vehicle, drone, or other device configured to automatically or manually manoeuvre through the lighting environment.

According to an embodiment, assessment system 300 comprises a training module 340 configured to receive or request data from the historical database 330 and to receive or request simulation data from simulation module 320. Training module 340 utilizes the data from the historical database and the simulation module to create a data model using one or more methods or algorithms. According to an embodiment, training module 340 estimates a global background model (GBM) from the historical database using the Gaussian mixture model (GMM) learning principle, and utilizing the simulated data from the simulation module as reference.

According to an embodiment, the Gaussian mixture model is a parametric probability density function represented as weighted sum of Gaussian component densities, in a scalar form as:

$$L(x) \sim \Sigma_{i=1}^{M} \omega_i \mathcal{N}(x; \mu_i, \sigma_i) \quad \text{(Eq. 1)}$$

or in a vector form as $$L(x) \sim \Sigma_{i=1}^{M} \omega_i \mathcal{N}(x; \mu_i, \Sigma_i) \quad \text{(Eq. 2)}$$

GMM is statistically parameterized by the mean vectors $\mu_i$, covariance matrices $\Sigma_i$, and mixture weights $\omega_i$. According to an embodiment, these parameters can be estimated by the expectation maximization, maximum likelihood, and maximum a posteriori algorithms.

According to an embodiment, the Gaussian densities can be in scalar and vector to fit different nature of data distributions. The estimated mean vectors $\mu_i$ can represent the light geolocation coordinates, and the covariance matrices $\Sigma_i$ can characterize street light illuminance outputs. The geolocated illuminance data can be characterized by independent Gaussian distributions, which by nature represent both first and higher order statistics. These parameters can calculate aspects such as street lighting metrics and benchmark light auditing with high order of fidelity. According to an embodiment, the output of training module 340 is asset localization.

According to an embodiment, assessment system 300 comprises an assessment module 350 configured to compare real-time measurement data 360 to the generated GBM for performance assessment and fault detection.

Real-time measurement or observational data 360 may be analyzed in real-time or may be analyzed after collection. For example, the observational data may be analyzed as it is collected, or it may be stored for analysis at a later time or date. Accordingly, multiple sets of observational data may be analyzed at one time. The real-time measurement or observational data may be obtained using any system for obtaining illuminance or other observational data about the one or more lighting units within the lighting system. For example, the real-time measurement or observational data may be obtained using a dynamic light measurement system or device, such as an automated or manual light-detecting and/or image-capturing device that moves through the lighting system. For example, the dynamic light measurement system or device may be a sensor or sensor array mounted on a vehicle, drone, or other device configured to automatically or manually manoeuvre through the lighting environment.

According to an embodiment, real-time measurement or observational data 360 may be augmented or enhanced by historical data. For example, when the real-time measurement or observational data is uploaded or otherwise provided to assessment system 300, a data enhancement module or algorithm 370 analyzes the fidelity of the observed data, such as parameters of amount and/or distribution, and determines that enhancement is necessary. For example, enhancement module 370 may comprise a predetermined threshold or other mechanism to determine that the fidelity of the obtained observational data is insufficient. The enhancement module can then receive or request data from the simulation module 320, and/or the historical database 330, and can augment or enhance the obtained observational data, with interpolation and/or fitting methods. For example, the enhancement may be based on the reference model generated by the simulation module.

According to an embodiment, assessment module 350 fits the real-time measurement or observational data, which may or may not be enhanced by enhancement module 370, to the GBM Gaussian densities from the training module 340, and estimates the observed weights $\omega'_i$. The module then compares the observed weights $\omega'_i$ to the GBM weights $\omega_i$ for the performance assessment and the fault detection. According to an embodiment, assessment module 350 may utilize one or more of the following comparison scenarios and decisions:

$\forall \omega'_i$, i=1, . . . , M, ε is the performance uncertainty/tolerance defined by lighting standards, luminaire specifications, or service level agreements if $|\omega'_i - \omega^*_i| < \varepsilon$ Measurement data are normal, Update into the historical database, elseif $|\omega'_i - \omega^*_i| > \varepsilon$ Performance assessment to re-estimate statistics from the realtime data, else $\omega'_i \approx 0$ or $|\omega'_i - \omega^*_i| >> \varepsilon$ Fault detection of a lighting unit.

The assessment module 350 may utilize one or more predetermined thresholds to quantify performance and/or detect a fault. The one or more predetermined thresholds may be based on one or more of a user-set threshold, thresholds set forth in a service-level agreement, machine-learned thresholds, or other thresholds. For example, one or more of the predetermined thresholds may be based on requirements for lighting compliance, roadway safety, city sustainability, and other parameters, settings, or requirements. According to one embodiment, one or more of the predetermined thresholds may be based on information from the photometric database. For example, the performance of a lighting unit may degrade over time in a known manner as set forth in the photometric database.

When the measurement data are normal, the observational data 360 can optionally be fed into the historical database 330 to enrich the training module. When the observed weights suggest an anomaly, the performance assessment can re-estimate one or more lighting metrics to check the anomaly. Fault detection can lead to further actions, such as transferring the fault information to the entities or authorities who are in charge of the light assets.

According to an embodiment, assessment system 300 comprises a user interface 380 configured to receive information from and/or provide information to a user. For example, the assessment system 300 may provide information to the user about one or more outcomes of the analysis, such as information about one or more lighting units, information about lack of faults, information about identified faults, two- or three-dimensional maps of simulated and/or observational data, or other information. The user interface may be co-located with one or more other components of the assessment system, or may be located remote from the other components of the assessment system. For example, user interface 380 may be a computer, monitor, smartphone, wearable, or other device in wired and/or wireless communication with one or more other components of the assessment system.

Figure 4:
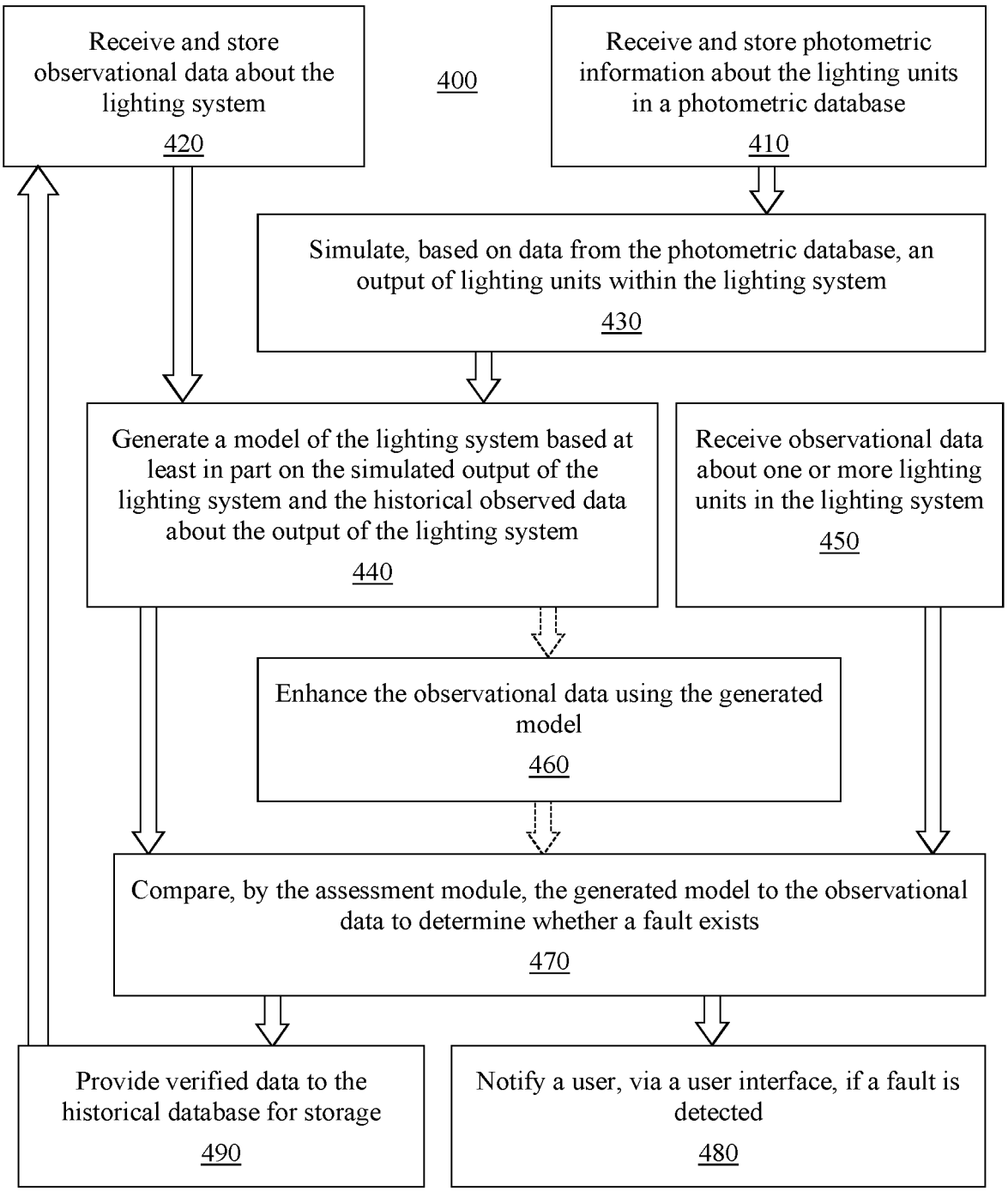
FIG. 4 is a flowchart of a method for analyzing output of a lighting unit in a lighting network, in accordance with an embodiment.

Referring to FIG. 4, in one embodiment, is a flowchart illustrating a method 400 for analyzing the output of a lighting unit in a lighting network. The method is configured to combine simulated data, historical data, and observational data into a model that localizes lighting units and assesses the performance of those lighting units. The method may utilize an assessment system 300 comprising one or more of a photometric database 310, simulation module 320, historical database 330, training module 340, assessment module 350, observational data 360, enhancement module 370, and/or user interface 380.

According to an embodiment, the method is configured to work with a lighting system 100 comprising a plurality of lighting units 10. Lighting system can be any of the embodiments described herein or otherwise envisioned, and the plurality of lighting units can include any of the components of the lighting units described in conjunction with FIG. 2. According to an embodiment, each lighting unit 10 is configured to illuminate all or a portion of a target surface within the lighting environment. According to one embodiment, the lighting unit is an outdoor lighting fixture such as a streetlight, parking lot light, or other lamp post or external lighting fixture configured to illuminate an exterior target surface. According to another embodiment, the lighting unit is an indoor lighting fixture such as a ceiling light or other internal lighting fixture configured to illuminate an interior target surface.

At step 410 of the method, the assessment system receives or retrieves photometric information about one or more of the lighting units within the lighting system, and stores it in photometric database 310. Photometric data may be supplied by the manufacturer and/or supplier of the lighting unit. According to an embodiment, assessment system 300 may be configured to automatically retrieve and store photometric data within photometric database 310, such as when lighting units are purchased or commissioned within the lighting system. The photometric information may comprise information about the performance of a lighting unit in one or more situations, such as different temperatures, different weather conditions, the spatial distribution of light output from the lighting unit, and other information.

At step 420 of the method, the assessment system receives or retrieves observational data collected within the lighting environment and stores it in historical database 330. The observational data collected about one or more of the plurality of lighting units within the lighting system may comprise illuminance data, among other data. According to an embodiment, the data is geo-located and thus the illuminance data about the one or more lighting units comprises information about the location of the lighting unit within the lighting system. The observational data may be collected by a dynamic light measurement system or device, such as an automated or manual light-detecting and/or image-capturing device that moves through the lighting system.

At step 430 of the method, a simulation module 320 of the assessment system accesses data within photometric database 310 and simulates a spatial lighting distribution of one or more of the lighting units within the lighting network of the lighting environment. For example, the simulation module may simulate the spatial lighting distribution of a plurality of streetlights located along a street, or a plurality of ceiling lights within a mall. According to an embodiment, the simulation module can consider a family of lighting simulation software and apply comprehensive simulation methodologies across all software to simulate the spatial lighting distribution. The simulation module may therefore simulate multiple lighting units, different street morphologies, mixed types of lighting units, and many other photometric characteristics.

At step 440 of the method, the training module 340 of the assessment system generates a model of the lighting system based at least in part on the simulated output of the lighting unit and the historical observed data about the output of the lighting unit. According to an embodiment, the model comprises localization information for one or more of the lighting units within the system.

According to an embodiment, training module 340 estimates a global background model (GBM) from the historical database using the Gaussian mixture model (GMM) learning principle, and utilizing the simulated data from the simulation module as reference. According to an embodiment, the Gaussian densities can be in scalar and vector to fit different nature of data distributions. The estimated mean vectors $\mu_i$ can represent the light geolocation coordinates, and the covariance matrices $\Sigma_i$ can characterize street light illuminance outputs. The geo-located illuminance data can be characterized by independent Gaussian distributions, which by nature represent both first and higher order statistics. These parameters can calculate aspects such as street lighting metrics and benchmark light auditing with high order of fidelity. According to an embodiment, the output of training module 340 is asset localization.

At step 450 of the method, observational data about one or more lighting units in the lighting system is received by the assessment system. According to an embodiment, the real-time measurement or observational data may be obtained using any system for obtaining illuminance or other observational data about the lighting units. The real-time measurement or observational data may be obtained using a dynamic light measurement system or device, such as an automated or manual light-detecting and/or image-capturing device that moves through the lighting system. Observational data may be analyzed as it is collected, or it may be stored for analysis at a later time or date. The observational data may be stored in the assessment system, or may be stored remotely and provided to or accessed by the system when needed during performance of the method.

At optional step 460 of the method, a data enhancement module 370 enhances the received observational data using the model generated by the training module. When observational data is provided to the assessment system, the data enhancement module analyzes the fidelity of the observed data, such as parameters of amount and/or distribution, and determines that enhancement is necessary. The enhancement module can then receive or request data from the simulation module 320, and/or the historical database 330, and can augment or enhance the obtained observational data, with interpolation and/or fitting methods.

At step 470 of the method, the assessment module 350 of the assessment system compares the observational data to the generated model to create a performance assessment and for fault detection. According to an embodiment, assessment module 350 fits the real-time measurement or observational data, which may or may not be enhanced by enhancement module 370, to the GBM Gaussian densities from the training module 340, and estimates the observed weights $\omega'_i$. The module then compares the observed weights $\omega'_i$ to the GBM weights $\omega_i$ for the performance assessment and the fault detection.

According to an embodiment, the assessment module 350 may utilize one or more predetermined thresholds to quantify performance and/or detect a fault. The one or more predetermined thresholds may be based on one or more of a user-set threshold, thresholds set forth in a service-level agreement, machine-learned thresholds, or other thresholds.

At step 480 of the method, if a fault is detected, the system notifies a user of the fault using the user interface 380. The notification may comprise information about the fault, such as the location of the lighting unit, the nature of the fault, the observational and/or historical data, the comparison to the generated model, and/or other information. The notification may be a visual warning, a light, a sound, a text, or any other notification. For example, the user interface may comprise a map of the lighting environment, and may display the location of the lighting unit comprising the fault. Many other methods for notifying the user of the fault are possible.

At step 490 of the method, if no fault is detected, the received observational data is stored in the historical database 330, and the data may be utilized in future iterations of the assessment method.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of" or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

The invention claimed is:

1. A method for analyzing output of one or more lighting units in a lighting system for fault detection, the method comprising the steps of:
    simulating, based on data from a photometric database, the output of a lighting unit;
    receiving, from a database of historical information, historical observed data about the output of the lighting unit, the historical observed data comprising illuminance data;
    receiving observed data about the output of the lighting unit;
    generating a model of the lighting system based at least in part on the simulated output of the lighting unit and the historical observed data about the output of the lighting unit, wherein the model comprises localization information for the lighting unit; and
    comparing the received observed data about the output of the lighting unit to the generated model, wherein a fault is detected if the received observed data varies from the generated model by a predetermined amount.

2. The method of claim 1, further comprising the step of notifying a user that a fault is detected.

3. The method of claim 1, further comprising the step of storing, only if no fault is detected, the received observed data about the output of the lighting unit in the database of historical output information.

4. The method of claim 1, wherein the predetermined amount is based on a lighting standard, a luminaire specification, and/or a service level agreement.

5. The method of claim 1, wherein the data stored in the photometric database comprises photometric information about one or more of the lighting units.

6. The method of claim 1, wherein the model of the lighting system comprises topographical information about the lighting environment.

7. The method of claim 1, wherein the model of the lighting system comprises geolocation information about one or more of the lighting units.

8. The method of claim 1, further comprising the step of enhancing, using the generated model, the receiving observed data.

9. The method of claim 1, wherein the generated model comprises a weight for each of the one or more lighting units, and wherein the received observed data comprises a weight for each of the one or more lighting units, wherein the step of comparing the received observed data to the generated model comprises comparing the model weight to the observed weight.

10. A system, configured to analyze the output of one or more lighting units, in a lighting system for fault detection, the system comprising:
    a historical database comprising historical observed data about the output of the one or more lighting units, the historical observed data comprising illuminance data;
    a photometric database comprising photometric information about the one or more lighting units;
    a simulation module configured to simulate, based on the data from the photometric database, the output of the one or more lighting units;
    a training module configured to generate a model of the lighting system based at least in part on the simulated output of the one or more lighting units and the historical observed data about the output of the one or more lighting units, wherein the model comprises localization information for the one or more lighting units; and
    an assessment module configured to compare received observed data to the generated model, wherein a fault is detected if the received observed data for one or more of the lighting units varies from the generated model for that lighting unit by a predetermined amount.

11. The system of claim 10, further comprising a user interface configured to provide information to a user about a detected fault.

12. The system of claim 10, further comprising an enhancement module configured to enhance, using the generated model, the receiving observed data.

13. The system of claim 10, wherein the generated model comprises a weight for each of the one or more lighting units, and wherein the received observed data comprises a weight for each of the one or more lighting units, wherein the assessment module is configured to compare the model weight to the observed weight.

14. The system of claim 10, wherein the predetermined amount is based on a lighting standard, a luminaire specification, and/or a service level agreement.

15. The system of claim 10, wherein the model of the lighting system comprises topographical information about the lighting environment.

* * * * *